United States Patent [19]

Iwasa et al.

[11] Patent Number: 4,590,587
[45] Date of Patent: May 20, 1986

[54] MAGNETIC BUBBLE MEMORY DEVICE

[75] Inventors: Seiichi Iwasa, Sagamihara; Kengo Nogiwa, Inagi; Yoshiya Kaneko, Tokyo, all of Japan

[73] Assignee: Fujitsu Limited, Kawasaki, Japan

[21] Appl. No.: 606,407

[22] Filed: May 2, 1984

[30] Foreign Application Priority Data

May 31, 1983 [JP] Japan .................................. 58-094961

[51] Int. Cl.⁴ ............................................ G11C 19/08
[52] U.S. Cl. ........................................ 365/1; 365/15
[58] Field of Search ...................................... 365/1, 15

[56] References Cited

U.S. PATENT DOCUMENTS 4,090,251  5/1978  Flannigan et al. ................... 365/15

FOREIGN PATENT DOCUMENTS 0041482  3/1983  Japan ...................................... 365/15
0141493  8/1983  Japan ...................................... 365/15

*Primary Examiner*—James W. Moffitt
*Attorney, Agent, or Firm*—Staas & Halsey

[57] ABSTRACT

A magnetic bubble memory device with major/minor loops includes at least one boot loop and a plurality of minor loops. Data stored in the boot loop in the form of bubbles are controlled by the reading out of the data independently from the minor loops. Header data are stored in the boot loop. Faulty loop data of the minor loops are stored in the minor loops with a certain positional relationship based on the header data. This results in allowing the device to be applied to a memory having a larger capacity, a higher production yield, and a high-speed detection time for faulty loop data.

16 Claims, 14 Drawing Figures

MAGNETIC BUBBLE MEMORY DEVICE

BACKGROUND OF THE INVENTION

The present invention relates to a magnetic bubble memory device, more particularly, to a magnetic bubble memory device wherein the storage arrangement of data for faulty minor loops is improved.

A magnetic bubble memory device is a solid state memory device having many advantages, for example, nonvolatility, easy rewriting, high reliability through the absence of mechanical moving portions, high resistance to environmental changes, high-speed access, and the like. These advantages, together with a tendency to be little affected by vibration and shock, have led to the use of this device as a small file memory in a terminal apparatus. Currently, such a device having a memory capacity of one mega-bit is under mass-production and, in the near future, a device having a memory capacity of four mega-bits will be commercially produced.

SUMMARY OF THE INVENTION

An object of the present invention is to provide a magnetic bubble memory device applicable to a device of more than 4 mega-bits, having a high production yield, and a high-speed detection time for the detection of faulty loop data.

According to one aspect of the present invention, there is provided a magnetic bubble memory device comprising: minor loops for data storage, in at least one predetermined page of which faulty loop data indicating a faulty minor loop are stored; and at least one boot loop for storing at least one header data to designate the predetermined page, and in which reading control of data memorized in the form of magnetic bubbles is performed independently from the minor loops; with the faulty loop data being read out from the minor loops based on the header data read out from the boot loop.

According to another aspect of the present invention, there is provided a magnetic bubble memory device assembly comprising a plurality of magnetic memory devices having major lines and minor loops for data storage, wherein: at least one of the plurality of magnetic bubble memory devices comprises a boot loop in which data memorized in the form of magnetic bubbles is read out independently from the minor loops; with the minor loops storing faulty loop data indicating a faulty minor loop at a predetermined page, the boot loop storing at least one header data to designate the predetermined page, and the faulty loop data being read out from the plurality of minor loops based on the header data read out from the boot loop.

DESCRIPTION OF THE PREFERRED EMBODIMENTS

To enable the advantages of the present invention to be more fully appreciated, it is necessary to first give a detailed description of the state of the prior art, with reference to the drawings.

Figure 1:
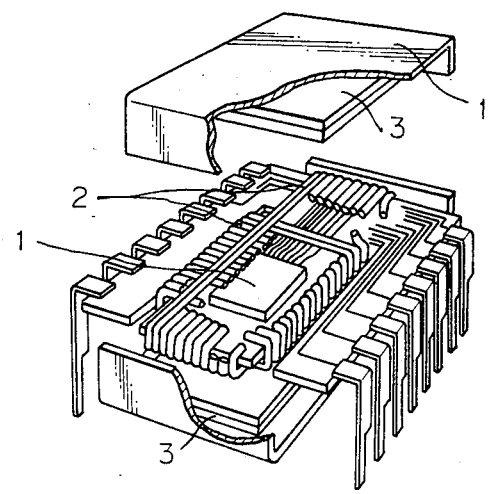
FIG. 1 is an exploded perspective view of a magnetic bubble memory device illustrating the background of the present invention.

FIG. 1 shows the configuration of a magnetic bubble memory device. This device comprises a magnetic bubble memory chip 1, rotation magnetic field generating coils 2, permanent magnets 3 for bias magnetic field, a shield case 4, and the like.

Usually, a magnetic bubble memory device comprises major/minor loops having major lines and a plurality of minor loops, in which data are stored. Devices having a major/minor loop configuration have a problem wherein faulty minor loops occur due to crystal defects or to pattern defects occurring at a certain rate. Therefore, the inclusion of a faulty minor loop at less than a predetermined rate is generally allowable. Data identifying the faulty minor loop is usually stored in the bubble memory device and read out by request when the power is switched on. A controller for the magnetic bubble memory device controls the device to prevent write-in of data in the faulty loops by the faulty loop data.

Figure 2:
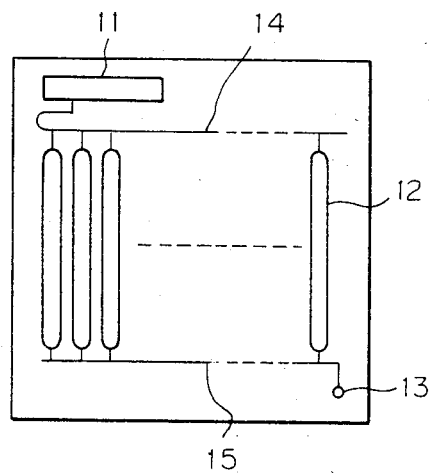
FIGS. 2, 3, and 4 show configurations of magnetic bubble memory devices as the background of the present invention.

FIG. 2 shows the configuration of a device having a capacity of one mega-bit. The device comprises a detector 11, minor loops 12, a generator 13, a read-out major line 14, and a write-in major line 15. The device has approximately 600 minor loops and each minor loop can store data of approximately 2000 bits.

Figure 3:
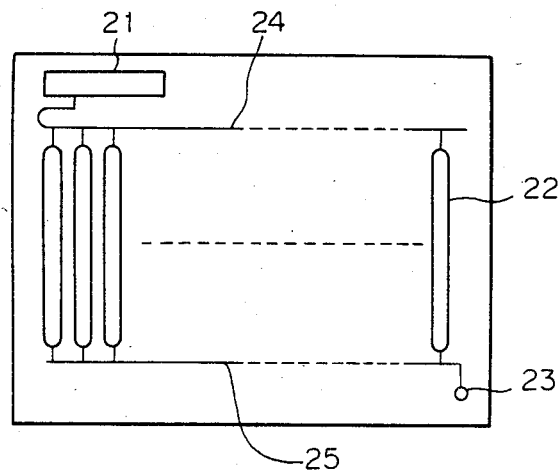

FIG. 3 shows the constitution of a device having a capacity of four mega-bits similar to the device in FIG. 2. This device comprises a detector 21, minor loops 22, a generator 23, a read-out major line 24, and a write-in major line 25. The device has approximately 2400 minor loops, and each minor loop can store data of approximately 2000 bits.

Figure 4:
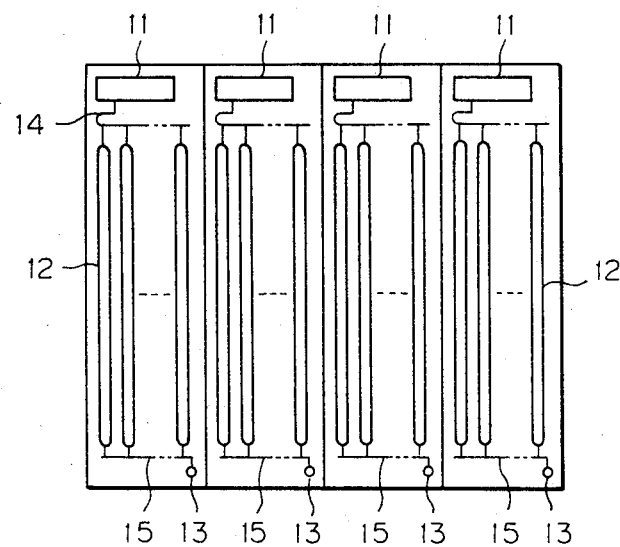

FIG. 4 shows the configuration of a device consisting of four blocks, each of which is a device of one mega-bit. Each block is the same as the device in FIG. 2.

Figure 5:
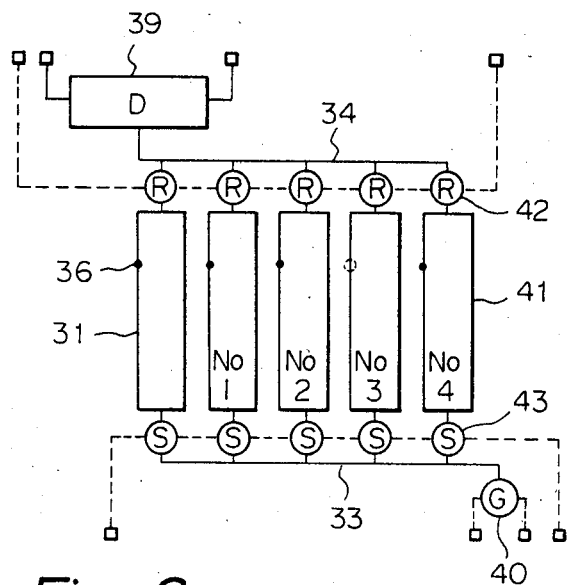
FIG. 5 explains the storage of faulty loop data in a conventional magnetic bubble memory device using a boot-page method.
Figure 6:
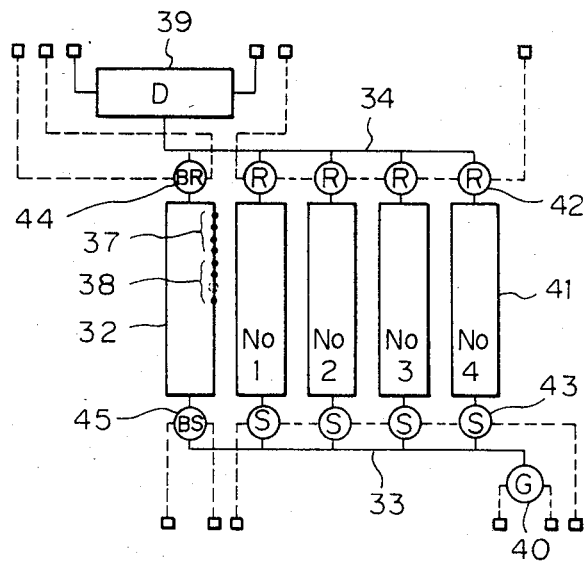
FIG. 6 explains the storage of faulty loop data in a conventional magnetic bubble memory device using a boot loop method.

FIGS. 5 and 6 show the configuration constitutions of conventional magnetic bubble memory devices, explaining the data storage of the faulty loops. The device shown in FIG. 5 uses a marker loop method or a boot-page method. The device shown in FIG. 6 uses a boot-loop method. Both devices comprise minor loops (No. 1~No. 4) 41, a write-in major line 33, a read-out major line 34, a detector (D) 39, replicators (R) 42, swap gates (S) 43, a generator (G) 40, and conductors (broken line). Only the device shown in FIG. 5 comprises a marker loop 31, and only the device shown in FIG. 6 comprises a boot loop 32, a boot replicator (BR) 44, and a boot swap gate (BS) 45. In the above description the devices have five minor loops, respectively, as a matter of convenience, although they actually include more than several hundred such loops.

The device shown in FIG. 5, using the marker loop method, uses one of a plurality of minor loops, for example, the one nearest to the detector 39, as a marker loop 31. Only one bubble 36 is written-in to the marker loop 31 as a marker. At the bit positions corresponding to the marker bit position in the minor loops No. 1~No. 4, when the minor loop is fault-free, data "1" is written, and when the minor loop is faulty, data "0" is written. As it is assumed in the figure that the minor loop No. 3 is a faulty loop, a bubble is not written at the bit position corresponding to the marker bit position in the minor loop No. 3. The corresponding bit positions in each minor loop are called a page.

After the above-mentioned storage of faulty loop data has been made, a power source is applied to the device, a controller (not shown) generates a rotating magnetic field for driving, bubbles in the marker loop 31 and the minor loops 41 are moved and, at the same time, replicator pulses are generated continuously at a predetermined time interval, and the marker bubble is detected. Assuming that the number of bits between the outlet of the marker loop 31 and the detector 39 is N bits, the bubble detected at the Nth period after the replicator pulse is generated is the marker. The data series of one page following the marker is the faulty loop data. In this operation, at worst, the marker is not detected until all the pages in the marker loop are read. Thus the effective access time is increased. For example, when one minor loop has a capacity of 2000 bits, the 1 mega-bit device has 600 minor loops, and the drive signal is 100 kHz, the required time for detecting the marker is at most 12 seconds.

In the device shown in FIG. 6 using the boot loop method, the device has a boot loop 32 independent of the minor loops No. 1~No. 4. This boot loop 32 is connected to the major lines 33 and 34 through the boot swap gate 45 and the boot replicator 44, respectively, and the swap gate 45 and replicator 44 have conductors independent of the other minor loops. This makes possible the exclusive access to the boot loop 32. In the boot loop 32 of the device, the special data known as header data 37 is written-in. Following the write-in of the header data 37, the faulty loop data 38 is stored. In this state, when the power source is applied, the controller generates the rotating magnetic field for driving and, at the same time, operates the boot replicator 44 continuously, and the data in the boot loop 32 is read out. The controller searches for the header data 37, and the data following the header data 37 is obtained as faulty loop data 38. In this case, assuming that one loop includes 2000 bits and the 1 mega-bit device having 600 minor loops is operated by the drive signal of 100 kHz, the longest time needed for detecting the header is $2000 \times 10$ μs=20 ms. Thus the effective access time is considerably reduced, when compared with the above-mentioned marker loop method.

The boot loop method is effective in the device having a capacity of only 1 mega-bit, however, where a high density device has a capacity of more than 4 mega-bits, this method has a remarkable defect. Namely, as shown in FIG. 3, since the 4 mega-bits device must provide a high density memory while maintaining the performance of the 1 mega-bit device, the same stored number of bits in one loop in the 4 mega-bits device is selected as for that of the 1 mega-bit device, and the number of the minor loop is four times larger. Therefore, the 4 mega-bits device includes 2400 minor loops, each having a storage capacity of 2000 bits. This means that the faulty loop data cannot be stored in one boot loop.

In an attempt to avoid this defect, the idea shown in FIG. 4 has been tried, in which the 4 mega-bits device consists of four 1 mega-bit devices and also has four boot loops. In this device, the four boot loops must be fault-free, and faulty loops are included at a certain probability ratio. Therefore, in these boot loops, faulty loops are produced at the same probability. That is, assuming that in a 1 mega-bit device one chip in ten has a faulty boot loop, the probability of all four boot loops being fault-free is $(9/10)^4 \approx 0.66$. As can be understood from this calculation, approximately one-third of the chips become defective and cannot be used for a magnetic bubble memory device. This is a considerable defect.

Figure 7:
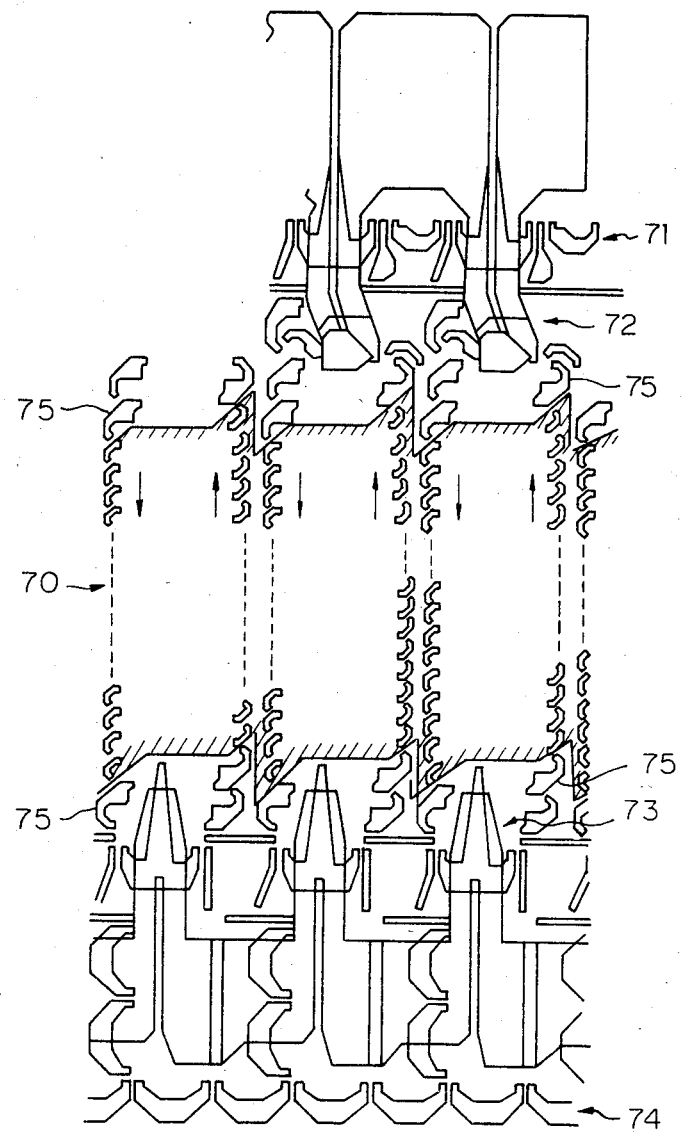
FIG. 7 is a plan view of a chip of a magnetic bubble memory device illustrating the background of the present invention.

FIG. 7 is a plan view of a magnetic bubble memory device showing the portions of minor loops and gates. In the figure the reference numerals 71, 72, 73, 74, and 75 are a write-in major line, a swap gate, a replicate gate, a read-out major line, and a soft magnetic pattern, respectively.

Now, embodiments of the present invention will be explained, with reference to the drawings.

Figure 8:
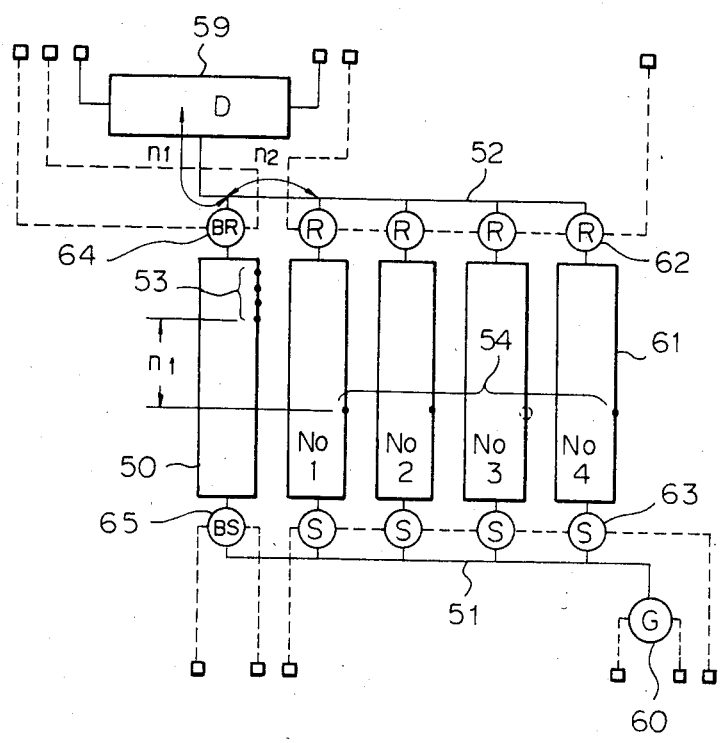
FIGS. 8 and 9 illustrate the storage of faulty loop data in a magnetic bubble memory device according to a first embodiment of the present invention.
Figure 9:
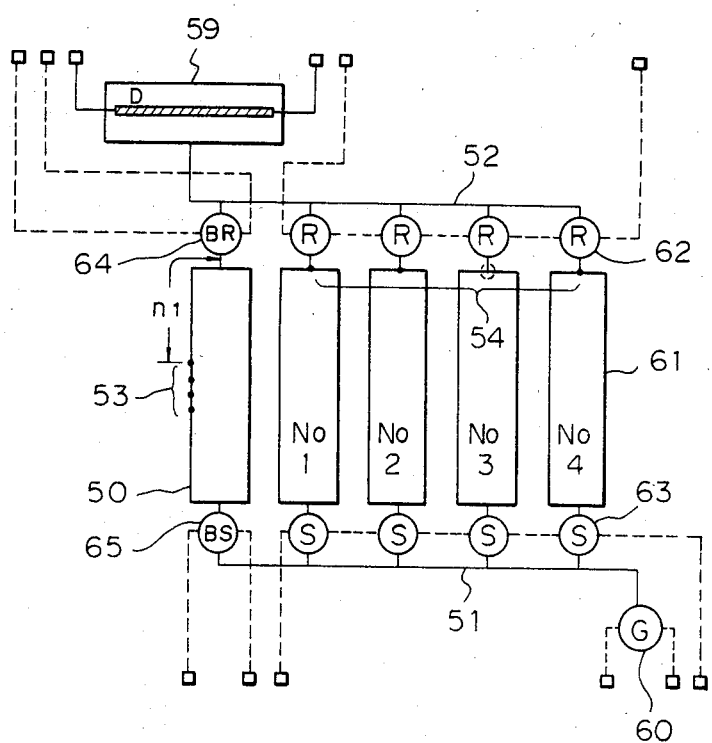

FIGS. 8 and 9 show the configuration of a magnetic bubble memory device according to a first embodiment of the present invention, explaining the storage of faulty loop data. In the drawing, the device comprises minor loops (No. 1~No. 4) 61, a boot loop 50, a write-in major line 51, a read-out major line 52, a detector (D) 59, replicators (R) 62, swap gates (S) 63, a boot replicator (BR) 64, a boot swap gate (BS) 65, a generator (G) 60, and conductors (shown by broken lines). Header data 53 is stored in the boot loop 50 and faulty loop data 54 stored in the minor loops 61.

In this embodiment, if the distance between the boot replicator 64 and the detector 59 is n1 bits, and the distance between the boot replicator 64 and the minor loop No. 1 is n2 bits, the faulty loop data 54 is stored at a page n1 bits apart from the page of the last bit of the header data 53. The magnetic bubbles are transferred the distance of n1 bits (number of bits) when the drive period is applied n1 times.

In this state, when the power source is supplied, a controller (not shown) generates a rotating magnetic field, continuously operates the boot replicator 64, and searches for the header data 53. When the last bit of the header data 53 passes through the detector 59, namely, when the header data 53 has been dectected, the page in which the faulty loop data is stored is positioned just before the replicator 62, as shown in FIG. 9. Consequently, when the controller generates the replicator pulse, the faulty loop data 54 is reproduced through the replicator 62, and the reproduced bubbles are then transferred on the read-out major line 52. Thus the header data is read out independently of the fault loop data. After (n1+n2) drive periods from this time, the bubble data detected from the detector 59 is the faulty loop data.

According to this embodiment, since only the header data 53 is stored in the boot loop 50, even when applying a device having more minor loops than there are bit numbers of the boot loop, wherein, in the conventional boot loop method, faulty loop data storage cannot be performed, the storage of the header data 53 can be processed with only one boot loop.

The time required for detecting the header data 53 is the same as for a conventional device using the boot loop method, and therefore, at most, the detection time is 20 ms. The time needed until the controller obtains all the faulty loop data becomes longer than for the conventional device using a boot loop method, by 10 $\mu s \times (n1+n2)$, where 10 $\mu s$ is a drive period. However, the values n1 and n2 are approximately 100 and 2, respectively, and therefore the excess time is about 1 ms, which is negligible.

Figure 10:
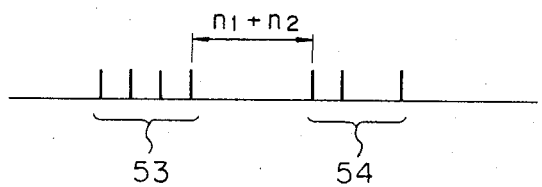
FIG. 10 explains the time relationship between a header detection signal and a detection signal for faulty loop data in the device shown in FIG. 8.

In FIG. 10, the above-mentioned time relationship between the detection signal for the header data and the detection signal for the faulty loop data is shown. The description (n1+n2) in the figure signifies that this interval is (n1+n2) drive periods.

Figure 11:
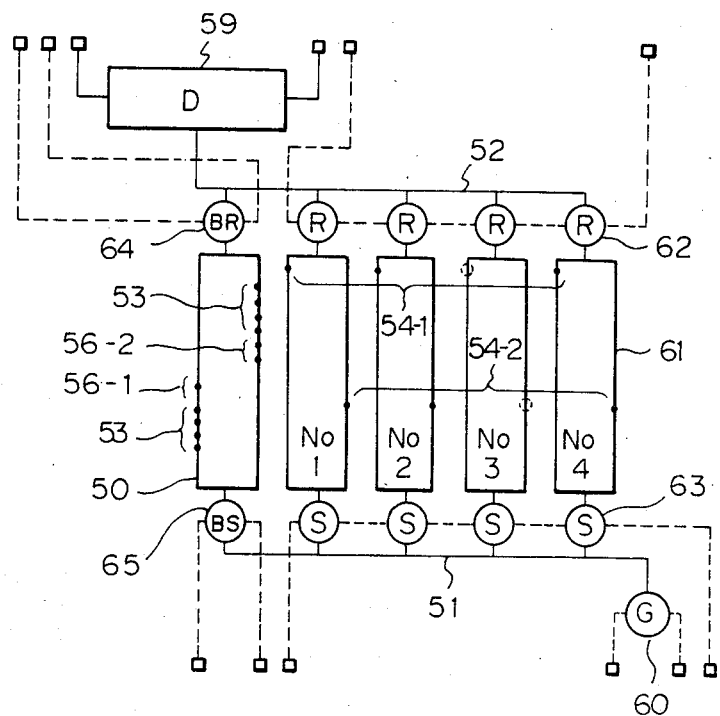
FIG. 11 illustrates the storage of faulty loop data in a magnetic bubble memory device according to a second embodiment of the present invention.

FIG. 11 shows a configuration of a magnetic bubble memory device according to a second embodiment of the present invention. In the figure, the same elements as in FIG. 8 are referred to by the same reference numerals.

The device of the second embodiment is different from the first embodiment, in that a plurality of headers 53 and addresses 56-1 and 56-2 to distinguish the headers are written in the boot loop 50. Similarly to the first embodiment, the faulty loop data 54-1 (corresponding to the address 56-1) and 54-2 (corresponding to the address 56-2) is written in at a page apart by the predetermined number of bits (or distance) from each header 53. When the power source is switched on, similarly to the first embodiment, the boot replicator 64 is operated continuously and the header data 53 is searched. In this case, since the plurality of headers 53 are memorized, (in the example shown in the figure, two headers 53 are memorized), compared with the device having only one header, only half the time, at longest, is required to detect the header data 53. The addresses 56-1 and 56-2 following the header data 53 designate which of the headers is detected.

In the device of the second embodiment, only the headers and the addresses are stored. The sum of the bit of a header and an address is at most several tens of bits, and therefore more than ten headers can be stored in the boot loop having a capacity of 2000 bits. In the case of storing ten headers, the effective access time for obtaining the faulty loop data is at the longest one tenth of the access time of the conventional device, namely about 2 ms. This results in a considerable reduction of the access time.

Figure 12:
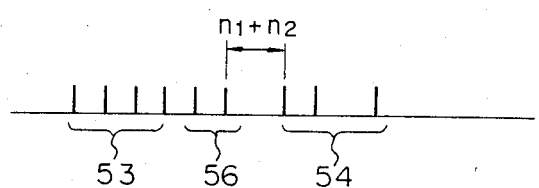
FIG. 12 explains the time relationship between a header detection signal and a detection signal for faulty loop data in the device shown in FIG. 11.

FIG. 12 shows the time relationship among a header detection signal, an address detection signal, and a faulty loop data detection signal which are detected by the detector 59.

Figure 13:
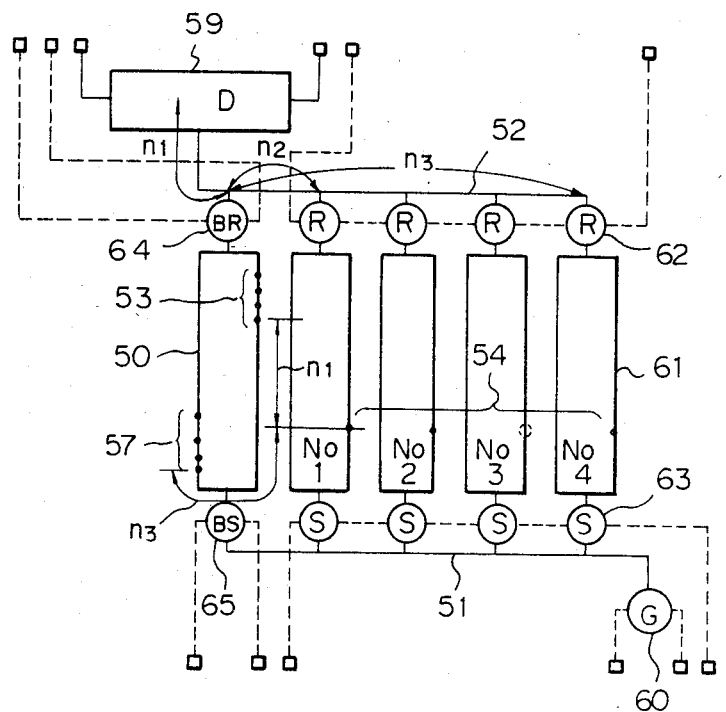
FIG. 13 explains the storage of faulty loop data in a magnetic bubble memory device according to a third embodiment of the present invention.

FIG. 13 shows a configuration of a magnetic bubble memory device according to a third embodiment of the present invention. In the figure, the same elements as in FIG. 8 are referred to by the same reference numerals.

In the device of the third embodiment, similarly to the first embodiment, the header data 53 is stored in the boot loop 50 and the faulty loop data 54 is stored at a page located apart from the header 53 by the predetermined number of bits. However, differently from the first embodiment, an error correction code (ECC) 57 is stored in the boot loop 50 following at a position separated by another predetermined number of bits (n3) from the page in which the faulty loop data are stored.

The ECC 57 is used to detect the error and for error correction. For example, the ECC is obtained as a excess value gained by dividing the binary coded faulty loop data by a specific binary function determined by the kind of code. The ECC used in this device can be any code, as long as it can be used to correct error of the faulty loop data.

When the power source is switched on, the controller searches the header data 53. As soon as the header data 53 is detected, the replicator pulse is applied to the replicator 62. After the predetermined number of bits the faulty loop data 54 is detected. Up to this point, the processes are the same as for the first embodiment. Additionally in this embodiment, the replicator pulse is generated. After an n3 drive period, the boot replicator 64 is again operated continuously. The number of bits n3 is set so that the detector 59 detects the ECC 57 in series just after the last of the faulty loop data 54.

Figure 14:
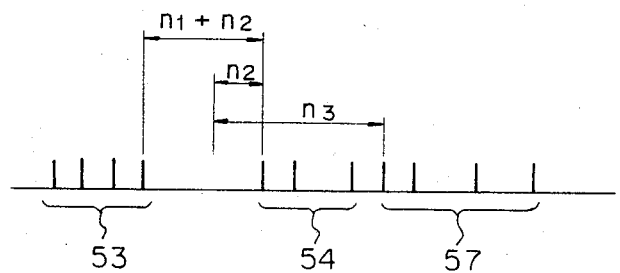
FIG. 14 explains the time relationship among a header detection signal, a detection signal for faulty loop data, and an ECC detection signal.

In FIG. 14, a time relationship among a header detection signal, a faulty loop data detection signal, and the ECC detection signal is shown.

Using the device of this embodiment, the error of the faulty loop data can be corrected by the ECC. Thus, the reliability of the device can be considerably increased. The ECC is at most less than 30 bits, and if the plurality of headers as shown in FIG. 11 and a plurality of ECC are stored in the boot loop, the boot loop cannot overflow.

In the above-mentioned embodiments, the present invention applies to a single magnetic bubble memory device, however, this invention can be applied to a magnetic bubble memory device assembly (e.g., FIG. 4) which comprises a plurality of magnetic bubble memory devices. In this case, the header data and the like is stored in a boot loop of at least one of the devices, and the other devices are controlled synchronously by a controller identical to that of the device having the boot loop. In this way, in the assembly, the faulty loop data stored in the minor loops of each device is processed in the same way as in a single device. The advantages of this invention are applicable in the assembly, as for the single device. As mentioned above, the capacity of the device according to the present invention can be extended over a wide range.

We claim:

1. A magnetic bubble memory device comprising:
   a plurality of minor loops for data storage, in at least one predetermined page of which faulty loop data indicating any respective faulty ones of said minor loops is stored;
   at least one boot loop for storing at least one header data to designate said predetermined page;
   a major line for reading out the data stored on said minor and boot loops; and
   control means for reading out onto said major line data stored in said boot loop independently of the reading out of said faulty loop data from said minor loops and for reading out said faulty loop data from said minor loops after said header data is read out from said boot loop;

wherein said predetermined page, at which said faulty loop data indicating said faulty minor loops is stored, is arranged at a position a predetermined number of bits apart from a page position in which the last bit of said header data is stored.

2. The device of claim 1, having a capacity of at least four mega-bits.

3. A magnetic bubble memory device as set forth in claim 1, wherein said predetermined number of bits is selected so that just after said header data stored in said boot loop is read out, said faulty loop data is transferred out to the major line from said minor loops.

4. A magnetic bubble memory device as set forth in claim 1 or 3, wherein a plurality of said header data and respective identifying data are stored in said boot loop.

5. A magnetic bubble memory device as set forth in claim 1 or 3, wherein an error correcting code for said faulty loop data is stored in said boot loop, and the page position of the top of said error correcting code is arranged a further predetermined number of bits apart from the page in which said faulty loop data is stored.

6. A magnetic bubble memory device as set forth in claim 4, wherein an error correcting code for said faulty loop data is stored in said boot loop, and the page position of the top of said error correcting code is arranged a further predetermined number of bits apart from the page in which said faulty loop data is stored.

7. A magnetic bubble memory device assembly comprising a plurality of magnetic bubble memory devices each including a major line and a plurality of minor loops for data storage, wherein
at least one of said minor loops of at least one of said magnetic bubble memory devices comprises a boot loop;
each of the others of said minor loops of the respective magnetic bubble memory devices, if faulty, stores at a predetermined page respective faulty loop data indicating a fault therein; and
each said boot loop stores at least one header data to designate the respective predetermined page;
said memory device assembly including control means for reading out the data from each said boot loop independently of reading out the respective faulty loop data from the other minor loops based on the header data read out from each respective boot loop.

8. A magnetic bubble memory device assembly as set forth in claim 7, wherein each said predetermined page, in which said faulty loop data is stored, is arranged at a position a respective predetermined number of bits apart from the respective page position in which the last header data is stored.

9. A magnetic bubble memory device assembly as set forth in claim 8, wherein said predetermined number of bits is selected so that just after said header data stored in said boot loop is read out, said faulty loop data is transferred out to the major line from said minor loops.

10. A magnetic bubble memory device assembly as set forth in claim 7, 8, or 9, wherein a plurality of said header data and respective identifying data are stored in each said boot loop.

11. A magnetic bubble memory device assembly as set forth in claim 7, 8, or 9, wherein an error correcting code for said faulty loop data is stored in each said boot loop, and the respective page position of the top of said error correcting code is arranged a further respective predetermined number of bits apart from the page in which said faulty loop data of the respective magnetic bubble memory device is stored.

12. A magnetic bubble memory device assembly as set forth in claim 10, wherein an error correcting code for said faulty loop data is stored in each said boot loop, and the respective page position of the top of said error correcting code is arranged a further respective predetermined number of bits apart from the respective page in which said faulty loop data of the respective magnetic bubble memory device is stored.

13. A magnetic bubble memory device assembly including at least first magnetic bubble memory device comprising
a plurality of minor loops storing respective fault data at a predetermined page,
a boot loop corresponding to said minor loops and having header data stored therein at a position corresponding to said predetermined page of said minor loops, said boot loop having a smaller number of storage locations than the number of said plurality of minor loops,
a major line for reading out the data stored in said minor and boot loops, and
control means for controlling said reading out to read out the data stored in said boot loop until said header data is detected, and for subsequently reading out said fault data from said minor loops.

14. The assembly of claim 13, comprising a plurality of further magnetic bubble memory devices, each said further device including respective ones of said minor loops having the same number of bits as said minor loops and boot loop for storing respective fault data at said predetermined page, wherein all of said fault data in said minor loops of all of said devices are read out depending on said header data in said boot loop of said first magnetic bubble memory device being detected.

15. The assembly of claim 7 or 14, having a capacity of significantly more than one mega-bit.

16. The assembly of claim 15, having a capacity of at least four mega-bits.

* * * * *

UNITED STATES PATENT AND TRADEMARK OFFICE
CERTIFICATE OF CORRECTION

PATENT NO. : 4,590,587
DATED : 20 May 1986
INVENTOR(S) : IWASA et al

It is certified that error appears in the above-identified patent and that said Letters Patent is hereby corrected as shown below:

Front page, [78] Inventors, "Inagi" should be --Kawasaki--.

FIGS. 1, 2, 3, 4 and 7 should be labeled --PRIOR ART--;

In FIG. 1, reference character "1" should be --4--.

Col. 2, line 64, delete "constitutions".

Col. 4, line 47, after "54" insert --is--.

Col. 5, line 50, "bit" should be --bits--.

Col. 6, line 9, "a" should be --an--;

Col. 6, line 22, delete "an";

Col. 6, line 22, "period" should be --periods--.

Col. 8, line 25, after "least" insert --a--.

Signed and Sealed this

Ninth Day of September 1986

[SEAL]

Attest:

DONALD J. QUIGG

Attesting Officer

Commissioner of Patents and Trademarks